(12) United States Patent
Lin et al.

(10) Patent No.: US 8,324,824 B2
(45) Date of Patent: Dec. 4, 2012

(54) 1-WIRE COMMUNICATION PROTOCOL AND INTERFACE CIRCUIT

(75) Inventors: Allan Ming-Lun Lin, Pleasanton, CA (US); Leonid A. Neyman, Sunnyvale, CA (US)

(73) Assignee: IXYS Corporation, Milpitas, CA (US)

(*) Notice: Subject to any disclaimer, the term of this patent is extended or adjusted under 35 U.S.C. 154(b) by 218 days.

(21) Appl. No.: 12/696,987

(22) Filed: Jan. 29, 2010

(65) Prior Publication Data
US 2010/0277104 A1 Nov. 4, 2010

Related U.S. Application Data

(60) Provisional application No. 61/148,318, filed on Jan. 29, 2009.

(51) Int. Cl.
*H05B 41/16* (2006.01)
(52) U.S. Cl. .................. 315/247; 315/307; 315/360
(58) Field of Classification Search .............. 315/291, 315/294, 307, 312, 317, 247, 308, 360
See application file for complete search history.

(56) References Cited

U.S. PATENT DOCUMENTS

| | | | |
|---|---|---|---|
| 2004/0155609 A1* | 8/2004 | Lys et al. | 315/292 |
| 2004/0160199 A1* | 8/2004 | Morgan et al. | 315/312 |
| 2006/0082331 A1* | 4/2006 | Ashdown | 315/291 |
| 2007/0029946 A1* | 2/2007 | Yu et al. | 315/291 |
| 2007/0285031 A1* | 12/2007 | Shteynberg et al. | 315/294 |

* cited by examiner

*Primary Examiner* — Tung X Le
(74) *Attorney, Agent, or Firm* — Kilpatrick Townsend & Stockton LLP (57) ABSTRACT

A 1-wire communication protocol and interface circuitry for communication between a host controller and a LED driver is provided. The 1-wire communication protocol is configured such that both PWM signals and DC current setting commands for programming the LED driver may be transmitted from the host controller to the LED driver via the same 1-wire interface. The 1-wire communication protocol uses the length of the pulses (pulse width), rather than the number of pulses, to distinguish between different modes of communication (PWM signal transmission mode or command pulse transmission mode) and different commands of the same type (specific DC current programming commands, or specific average PWM drive current for the LED, within each transmission mode). Because the same 1-wire interface is used for transmitting both PWM signals and DC current commands, integrated circuits for the host controller and the LED driver do not require an additional wire or pin.

23 Claims, 6 Drawing Sheets

1-WIRE COMMUNICATION PROTOCOL AND INTERFACE CIRCUIT

CROSS-REFERENCES TO RELATED APPLICATIONS

The present application claims priority to U.S. Provisional Patent Application No. 61/148,318, filed on Jan. 29, 2009, which is incorporated by reference in its entirety.

TECHNICAL FIELD

The present invention relates to a communication protocol and interface circuit for communication between a host device and a driver device using a single wire interface.

BACKGROUND

Light-Emitting Diodes (LEDs) are being used increasingly in display devices, lighting applications, etc. For example, some modern liquid crystal display (LCD) devices use white LEDs as the backlight for the LCD display. These LEDs are typically driven by an LED driver that functions as a constant current device to supply a constant sink current fed through the LEDs to provide a constant luminescence or that functions as average current devices to supply a switching pulse width modulation sink current fed through the LEDs to provide a dimming luminescence. The amount of constant sink current driving the LEDs by the LED driver is typically controlled by a host controller residing in an electronic device (e.g., a mobile telephone, computer, etc.) that utilizes the LEDs.

The host controller interfaces with the processor of the electronic device to receive pulse width modulation (PWM) commands directing the average intensity of illumination to be generated by the LED driver, and sends the PWM signals to the LED driver to adjust the average current for driving the LEDs. The host controller also communicates with the LED driver to send a variety of commands other than the PWM signals to the LED driver to program the LED driver, such as commands for setting the DC current to be provided by the LED driver to the LEDs.

Conventional communication protocols and interface circuitry between a host controller and a LED driver require two separate communication channels (e.g., wires and IC pins) for communication of the PWM signals and the commands for programming the LED driver. Specifically, conventional 1-wire communication protocols are typically used by the host controller to communicate commands for programming the LED driver based on the number of pulses sent via the conventional 1-wire interface. All pulses sent over the conventional 1-wire interface are typically interpreted as commands. The conventional 1-wire communication protocols cannot be used for dynamic communication of PWM signals to adjust the average current for driving the LEDs. Thus, conventional LED drivers require an additional control pin on the LED driver integrated circuit (IC) to receive PWM pulses for adjusting the average LED drive current, in addition to the pin used by the 1-wire interface to receive commands from the host controller. This adds to the complexity and manufacturing cost of the LED driver and host controller ICs.

SUMMARY

According to various embodiments of the present invention, a 1-wire communication protocol and interface circuitry for communication between a host device (e.g., host controller) and a driver device (e.g., LED driver) is provided. The 1-wire communication protocol is configured such that both PWM signals and other commands (e.g., DC current setting commands) for programming the LED driver may be transmitted from the host controller to the LED driver via the same 1-wire interface. The 1-wire communication protocol uses the length of the pulses (i.e., pulse width), rather than the number of pulses, to distinguish between different modes of communication (PWM signal transmission mode or command pulse transmission mode) and different commands of the same type (specific DC current programming commands, or specific average PWM drive current for the LEDs, within each transmission mode). Because the same 1-wire interface is used for transmitting both PWM signals and programming commands for the LED driver, the same 1-wire interface may be used by the host controller and the LED driver for both DC current programming and PWM current adjustment without an additional wire or an additional pin on the host controller IC and the LED driver IC.

In some embodiments, a communication system includes a host device and a driver device coupled to the host device via a 1-wire interface. The host device includes a first 1-wire interface controller and the driver device includes a second 1-wire interface controller. The second 1-wire interface controller communicates with the first 1-wire interface controller via a 1-wire communication protocol. Interface commands are transmitted from the host device to the driver device via the 1-wire interface and are decoded by the second 1-wire interface controller. The interface commands include PWM signals and command signals for programming the driver device. The 1-wire communication protocol transmits the PWM signals during PWM signal transmission mode and transmits the command signals during command signal transmission mode.

In some embodiments, a communication system includes a host controller, an LED driver device coupled to the host controller via a 1-wire interface, and a plurality of LEDs coupled to the LED driver. The host controller includes a first 1-wire interface controller, and the LED driver includes a second 1-wire interface controller. The second 1-wire interface controller communicates with the first 1-wire interface controller via a 1-wire communication protocol. Interface commands are transmitted from the host controller to the LED driver via the 1-wire interface and are decoded by the second 1-wire interface controller. The interface commands include pulse width modulation (PWM) signals and command signals for programming the LED driver. The 1-wire communication protocol transmits the PWM signals during PWM signal transmission mode and transmits the command signals during command signal transmission mode. Each interface command comprises a preamble pulse, at least one command pulse and a post amble pulse. Each interface command begins with the preamble pulse and ends with the post amble pulse.

BRIEF DESCRIPTION OF THE DRAWINGS

The teachings of the embodiments of the present invention can be readily understood by considering the following detailed description in conjunction with the accompanying drawings.

DETAILED DESCRIPTION

Reference will now be made in detail to several embodiments of the present invention, examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
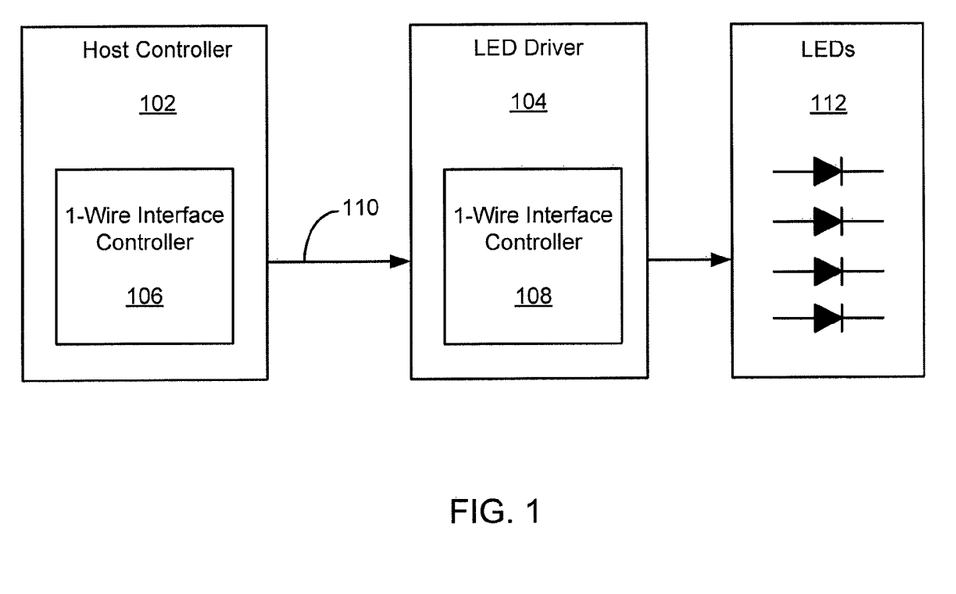
FIG. 1 illustrates an LED driver system controlled by a host controller using a 1-wire communication protocol and interface circuitry, according to one embodiment of the present invention.

According to various embodiments of the present invention, a 1-wire communication protocol and interface circuitry for communication between a host device (e.g., a host controller) and a driver device (e.g., an LED driver) is disclosed. FIG. 1 illustrates an LED driver system controlled by a host controller 102 using a 1-wire communication protocol and interface circuitry to communicate with an LED driver 104 to drive a plurality of LEDs 112, according to one embodiment of the present invention. The host controller 102 includes a 1-wire interface controller 106, and the LED driver 104 also includes a 1-wire interface controller 108. Both 1-wire interface controllers 106, 108 communicate with each other on a single wire interface 110, using the 1-wire communication protocol according to the present invention, as will be explained in more detail below with reference to FIG. 2A and FIG. 2B.

The 1-wire communication protocol is configured such that both PWM signals and other commands (e.g., DC current setting commands) for programming the LED driver 104 may be transmitted from the host controller 102 to the LED driver 104 via the same 1-wire interface 110 using the 1-wire communication protocol. The 1-wire communication protocol uses the length of the pulses (i.e., pulse width), rather than the number of pulses, to distinguish between different modes of communication (e.g., PWM signal transmission mode or command pulse transmission mode) and different commands of the same type (e.g., specific DC current programming commands, or specific average PWM drive current for the LED, within each transmission mode). Because the same 1-wire interface 110 is used for transmitting both PWM signals and programming commands for the LED driver 104, the same 1-wire interface 110 may be used by the host controller 102 and the LED driver 104 for both DC current programming and PWM current adjustment without an additional wire or an additional pin on the host controller IC and the LED driver IC.

Figure 2A:
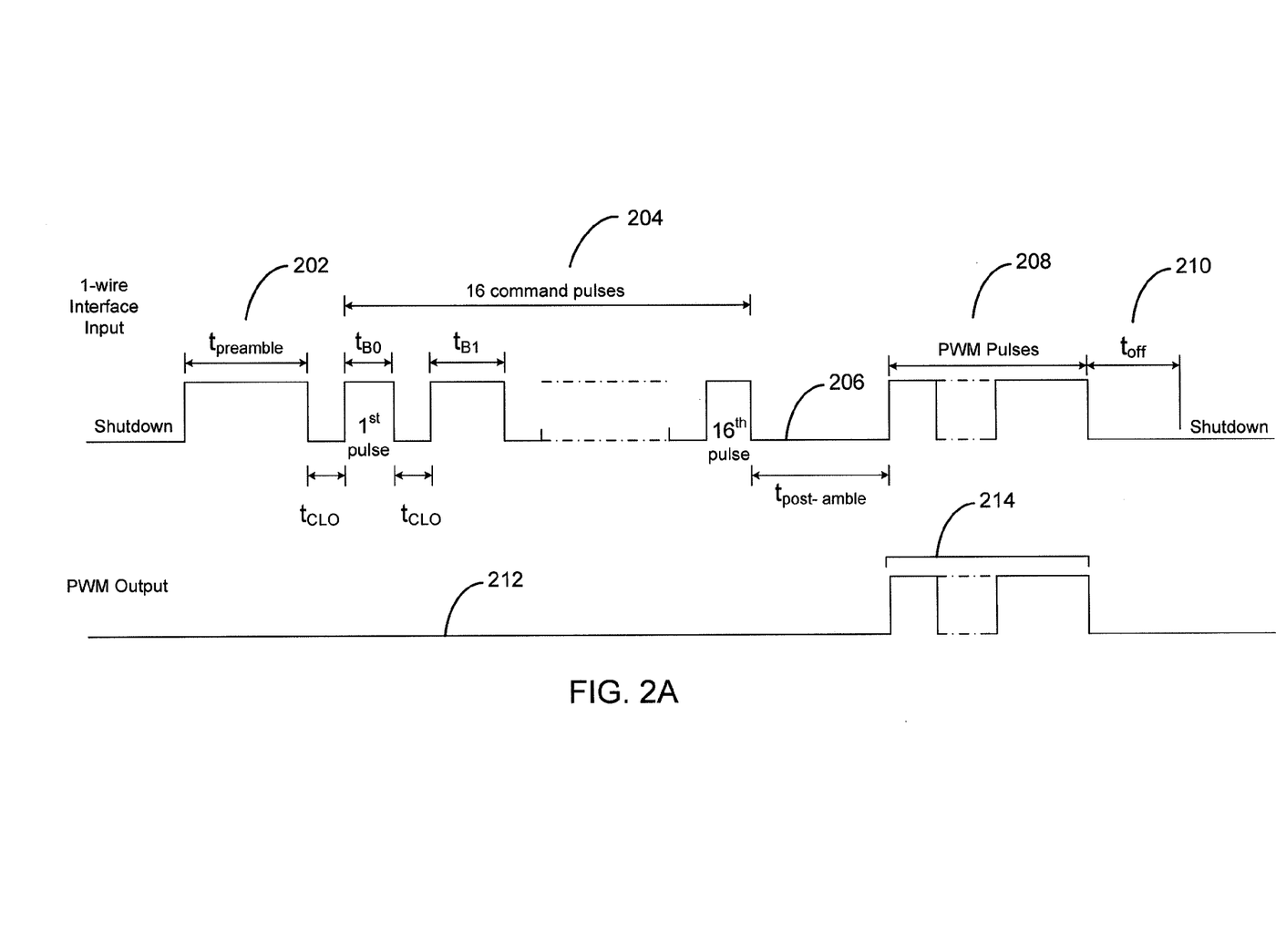
FIG. 2A and FIG. 2B are timing diagrams illustrating the 1-wire communication protocol, according to one embodiment of the present invention.
Figure 2B:
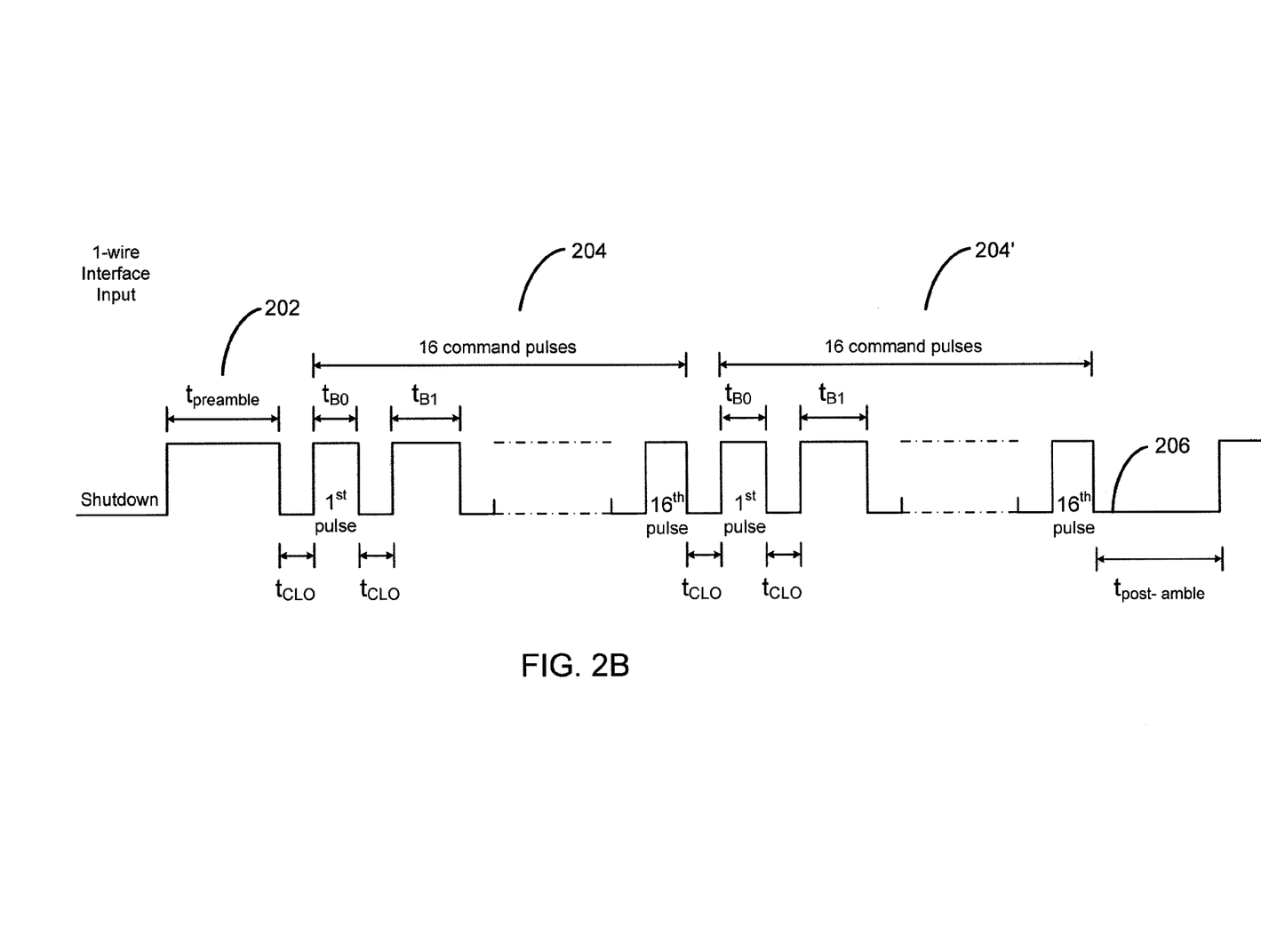
Figure 3:
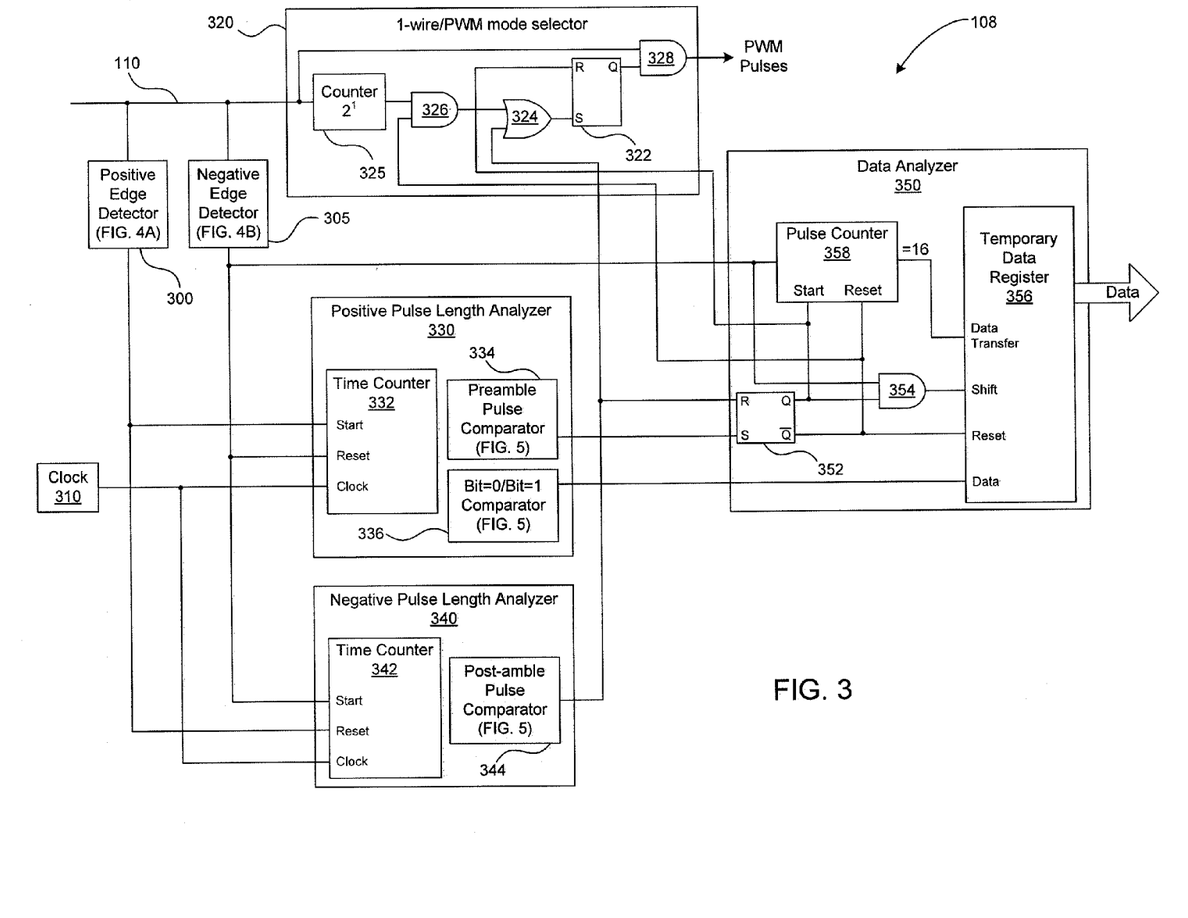
FIG. 3 illustrates the 1-wire communication interface circuitry in the LED driver, according to one embodiment of the present invention.

FIG. 2A and FIG. 2B are timing diagrams illustrating the 1-wire communication protocol, according to one embodiment of the present invention. Referring to FIG. 2A, the 1-wire communication protocol uses pulse width to determine binary zero/one for programming the DC current. After programming the DC current as peak current, a continuous pulse width is used for adjusting the PWM average current of the LED driver 104. The pulse patterns shown in FIGS. 2A and 2B can be generated by any digital logic circuitry in the 1-wire interface controller 106 of the host controller 102, and then decoded by the 1-wire interface controller 108 in the LED driver 104, using, for example, decoder circuitry as shown in FIG. 3.

Each 1-wire interface command starts with a preamble pulse 202. A pulse is considered a preamble pulse if the pulse is at a logic level HIGH for at least as long as a predetermined preamble pulse period ($t_{preamble}$).

Once the preamble pulse 202 is recognized, subsequent pulses are recognized as command pulses 204, for example, commands for programming the DC current to be provided by the LED driver 104. Any number of commands 204 may follow the preamble pulse 202, and each command 204 contains N pulses. The example shown in FIG. 2A uses sixteen pulse commands (N=16). Each of the sixteen pulses is recognized as a binary zero or binary one, depending upon whether the pulse width is $t_{B0}$ or $t_{B1}$, respectively. There is a low period ($t_{CLO}$) between each of the command pulses 204 to distinguish between the command pulses 204. Thus, the sixteen command pulses may encode up to $2^{16}$ commands that may be used to transmit command information from the host controller 102 to the LED driver 104.

Transmission of commands (i.e., the command pulse transmission mode) ends with a post-amble pulse 206. A pulse is considered a post-amble pulse if the pulse is at logic level LOW for at least as long as a predetermined post-amble pulse period ($t_{post-amble}$). Once the post-amble pulse 206 is recognized, the 1-wire communication protocol transitions into PWM pulse transmission mode, until the next preamble pulse 202 is recognized. Thus, subsequent pulses 208 are recognized as PWM pulses. PWM pulses 208 are not recognized as encoding binary ones or zeros depending on pulse width. Rather, the width of the PWM pulses 208 are recognized as the average LED drive current to be provided by the LED driver 104. The PWM pulse transmission mode ends with a shutdown pulse 210 that is at logic level LOW for longer than a predetermined shutdown period ($t_{off}$). Once the shutdown pulse 210 is recognized, the 1-wire communication protocol enters shutdown mode.

As explained above, the 1-wire communication protocol may send an unlimited number of command pulses 204 in command pulse transmission mode before entering the PWM pulse transmission mode. For example, FIG. 2B shows a multi-command pulse sequence, where each subsequent sixteen-pulse command 204' is sent immediately after a previous sixteen-pulse command 204 without interruption. The time difference between the sixteenth pulse of the first sixteen-pulse command 204 and the first pulse of the second sixteen-pulse command 204' is equal to the low period ($t_{CLO}$). The first command 204 starts with the preamble pulse 202 and the last command (e.g., the second command 204') ends with the post-amble pulse 206 to enter the PWM pulse transmission mode.

FIG. 3 is a block diagram illustrating the 1-wire communication interface circuitry of the 1-wire interface controller 108 in the LED driver 104, according to one embodiment of the present invention. The 1-wire communication interface circuitry is used to decode the command pulses and the PWM pulses generated by the host controller 102 using the 1-wire communication protocol illustrated in FIGS. 2A and 2B.

The 1-wire communication interface circuitry includes a positive pulse edge detector 300, a negative pulse edge detector 305, a clock 310, a 1-wire/PWM mode selector 320, a positive pulse length analyzer 330, a negative pulse length analyzer 340, and a data analyzer 350. The positive pulse edge detector 300 and the negative pulse edge detector 305 detect positive and negative edges, respectively, of incoming pulses on the 1-wire interface 110, and trigger the operation of the positive pulse length analyzer 330 and the negative pulse length analyzer 340, respectively. The positive pulse length analyzer 330 includes a time counter 332, a preamble pulse comparator 334 and a bit=0/bit=1 comparator 336. The negative pulse length analyzer 340 includes a time counter 342 and a post-ample pulse comparator 344. The clock 310 provides a clock signal to the time counter 332 of the positive pulse length analyzer 330 and the time counter 342 of the negative pulse length analyzer 340. The 1-wire/PWM mode selector includes an R-S flip-flop 322, an OR gate 324, a counter 325 and two AND gates 326, 328. The data analyzer 350 includes an R-S flip-flop 352, an AND gate 354, a temporary data register 356 and a pulse counter 358.

Referring to FIG. 3 together with FIG. 2A, after power-up, the 1-wire communication interface circuitry waits for a first incoming positive pulse to arrive through the 1-wire interface 110. In accordance with the 1-wire communication protocol of the present invention, if the first pulse is a preamble pulse 202, data transfer begins in the command pulse transmission mode. The positive edge of the preamble pulse 202 is detected by the positive edge detector 300, and the positive edge detector 300 starts the time counter 332 of the positive pulse length analyzer 330. The time counter 332 stops and is reset by a negative pulse edge detected by the negative pulse edge detector 305. Thus, the time counter 332 determines a pulse width between the positive and negative edges of the first pulse between start and stop/reset conditions, respectively, in terms of the number of pulses of the clock signal provided by the clock 310.

The determined pulse width is compared with a predetermined preamble pulse length ($t_{preamble}$) in the preamble pulse comparator 334. If the determined pulse width is equal to the predetermined preamble pulse length ($t_{preamble}$), the first pulse is recognized as a preamble pulse 202, and the preamble pulse comparator 334 generates a pulse that sets the R-S flip-flop 352 of the data analyzer 350. As a result, the R-S flip-flop 352 outputs a logic level HIGH at a non-inverting output Q to one input of the AND gate 354 and a logic level LOW at an inverting output ~Q to a "reset" input of the temporary data register 356.

Once the preamble pulse 202 is recognized, the subsequent incoming pulses through the 1-wire interface 110 are recognized as data pulses that correspond to one of the sixteen command pulses. They are analyzed in the same way as the preamble pulse, i.e., positive and negative edges are detected by the positive edge detector 300 and negative edge detector 305, respectively, with the pulse length between the positive and negative edges being determined by the time counter 332. The determined pulse length is compared with a predetermined pulse length ($t_{B0}$ or $t_{B1}$) corresponding to bit=0 or bit=1 in the bit=0/bit=1 comparator 336, to determine whether the pulse length corresponds to bit=0 or bit=1. If the pulse width corresponds to $t_{B0}$, the data pulse is detected as bit=0. If the pulse width corresponds to $t_{B1}$, the data pulse is detected as bit=1. The detected data is output from the comparator 336 and is provided to a "data" input of the temporary data register 356.

The temporary data register 356 is a shift register that shifts by one bit at every negative pulse edge detected by the negative pulse edge detector 305. As shown in FIG. 3, the "shift" input to the temporary data register 356 is provided by the output of the AND gate 354. A first input to the AND gate 354 is the output of the negative edge detector 305, and a second input to the AND gate 350 is the non-inverting (Q) output of the R-S flip flop 352. Thus, the "shift" input to the temporary data register 356 is at logic level HIGH when a negative pulse edge is detected on the 1-wire interface 110 after a preamble pulse is detected by the preamble pulse comparator 334. Thus, as the data pulses (i.e., sixteen commands pulses) are received through the 1-wire interface 110, the data is recognized and input to the temporary data register 356 by the bit=0/bit=1 comparator 336. The previously input data is shifted by one bit at the negative edge of the data pulse so that subsequently recognized data can be input to the temporary data register 356. In this manner, the serially received data corresponding to the sixteen command pulses can be stored in the temporary data register 356 and shifted at the negative edge of each command pulse for simultaneous parallel output.

The pulse counter 358 counts the number of pulses received via the 1-wire interface 110, as indicated by the negative edges of the pulses detected by the negative pulse edge detector 305. As explained above, each command 204 is represented by sixteen consecutive pulses following the preamble pulse 202. When the number of command pulses 204 counted by the pulse counter 358 equals sixteen, the pulse counter 358 generates and provides a pulse to the "data transfer" input of the temporary data register 356 to transfer the stored command data from the temporary data register 356 into a permanent data register (not shown) in the LED driver 104. The transferred command data is used, for example, to set the DC current to be provided by the LED driver 104 to the LEDs 112.

If the total number of command pulses 204 is less than sixteen, or if data transfer is interrupted, or if the time between two consecutive data pulses is longer than the end command mode negative pulse (i.e., the post-amble pulse 206), the temporary data register 356 is reset, and the 1-wire interface 110 transitions to the PWM pulse transmission mode. In the PWM pulse transmission mode, each incoming pulse to the 1-wire interface 110 is interpreted as a PWM pulse rather than a command pulse.

The negative pulse length analyzer 340 is used to detect the transition to the PWM pulse transmission mode. A negative pulse edge of the sixteenth (i.e., last) command pulse is detected by the negative pulse edge detector 305. The length of the logic level LOW following the negative pulse edge is determined by the time counter 342. Specifically, the negative edge detector 305 starts the time counter 342 upon detecting the negative pulse edge of the sixteenth command pulse. The positive edge of the first PWM pulse 208 is detected by the positive edge detector 300, which resets (i.e., stops) the time counter 342. Thus, the length of the logic level LOW between the negative edge of the last command pulse 204 and the positive edge of the first PWM pulse 208 is determined by the time counter 342 in terms of the number of pulses from the clock 310 written into the time counter 342 between start and stop/reset events.

The determined length of the logic level LOW is compared by the post-amble pulse comparator 344 with a predetermined post-amble pulse length ($t_{post-amble}$). If the determined length of the logic level LOW is equal to the predetermined post-amble pulse length $t_{post-amble}$, the post-amble pulse comparator 344 generates a pulse that resets the R-S flip-flop 352 of the data analyzer 350 and sets the R-S flip-flop 322 of the 1-wire/PWM mode selector 320 via the OR gate 324. As a result, the R-S flip-flop 352 outputs a logic level LOW at the non-inverting (Q) output and a logic level HIGH at the inverting (~Q) output. Thus, the AND gate 354 of the data analyzer 350 outputs a logic level LOW to the "shift" input of the temporary data register 356, thereby preventing a shifting operation in the temporary data register 356 at the negative pulse edges of subsequent pulses. The logic level HIGH at the inverting (~Q) output of the R-S flip flop 352 resets data in the temporary data register 356, resets the pulse counter 358 thereby preventing subsequent incoming pulses from being written as data in the temporary data register 356, and transitions the 1-wire interface 110 into the PWM pulse transmission mode.

If the first incoming pulse on the 1-wire interface 110 after a power-up pulse is not a preamble pulse 202, the first incoming pulse is ignored and the next pulse is recognized as a PWM pulse 208. The 1-wire/PWM mode selector 320 determines this condition and allows the second and subsequent pulses to be recognized as PWM pulses.

Specifically, the counter 325 of the 1-wire/PWM mode selector 320 counts the number of incoming pulses up to two pulses, and sets output to a logic level HIGH at the second incoming pulse, which is provided as one input of the AND gate 326. The other input of the AND gate 326 is provided by the inverting (~Q) output of the R-S flip-flop 352 of the data analyzer 350. If the first pulse is not a preamble pulse, the inverting (~Q) output of the R-S flip-flop 352 will be at a logic level HIGH, since the preamble pulse comparator 334 would not have set the R-S flip flop 352. Thus, when the counter 325 outputs a logic level HIGH at the second pulse, the AND gate 326 outputs a logic level HIGH to one of the inputs of the OR gate 324, thereby setting the R-S flip-flop 322 of the 1-wire/PWM mode selector 320. Thus, the non-inverting (Q) output of the R-S flip-flop 322 becomes a logic level HIGH, which is provided as one input to the AND gate 328 of the 1-wire/PWM mode selector 320. The other input to the AND gate 328 is from the 1-wire interface 110. Thus, all subsequent incoming pulses pass through the AND gate 328 and are recognized as PWM pulses for setting the average LED drive current to be provided to the LEDs 112 by the LED driver 104.

If a preamble pulse 202 is detected, as explained above, the preamble pulse comparator 334 sets the R-S flip-flop 352 of the data analyzer 350, which in turn resets the R-S flip-flop 322 of the 1-wire/PWM mode selector 320, to prevent subsequent pulses from being recognized as PWM pulses. The OR gate 324 is used to set the R-S flip-flop 322 either via the counter 325 (if no preamble pulse is detected) or via the post-amble pulse comparator 344 (if the 1-wire command transmission mode ends or is interrupted). The AND gate 326 prevents the R-S flip-flop 322 from being set by the counter 325 in case a preamble pulse 202 is detected. Specifically, the non-inverting (~Q) output of the R-S flip-flop 352 of the data analyzer 350 is at a logic level LOW when the preamble pulse 202 is detected. Thus, the output of the AND gate 326 is also at a logic level LOW, which is provided as one input to the OR gate 324. The other input to the OR gate 324 is also at a logic level LOW, since the post-amble pulse comparator 344 outputs a logic level LOW prior to detection of the post-amble pulse 206. Thus, output of the OR gate 324 is at a logic level LOW and the non-inverting (Q) output of the R-S flip-flop 322 is also at a logic level LOW, thereby preventing the 1-wire interface 110 from entering the PWM pulse transmission mode.

Finally, the frequency (f) of the clock 310 determines the resolution of pulse length measurement s=1/f. The capacities of the time counters 332, 342 are equal or greater than $t_{preamble} \times f$ and $t_{post-amble} \times f$, respectively.

Figure 4A:
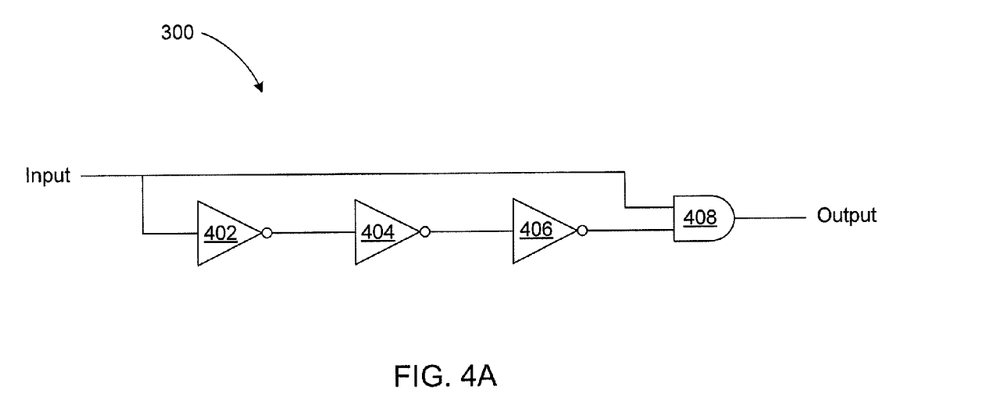
FIG. 4A illustrates a positive edge detector, according to one embodiment of the present invention.

FIG. 4A illustrates the positive pulse edge detector 300, according to one embodiment of the present invention. The positive pulse edge detector 300 includes three invertors 402, 404, 406 followed by a two-input AND gate 408. The three invertors 402, 404, 406 are connected in series to add a propagation delay to an inverted input to the positive pulse edge detector 300. Both the input and the inverted-delayed input (via invertors 402, 404, 406) are provided as the two inputs to the AND gate 408. Thus, the output of the AND gate 408 is at a logic level HIGH if the input signal to the positive pulse edge detector 300 transitions from a logic level LOW to a logic level HIGH, until the inverted-delayed input transitions from a logic level HIGH to a logic level LOW. The pulse length of the output of the AND gate 408 is equal to the propagation delay in the three invertors 402, 404, 406.

Figure 4B:
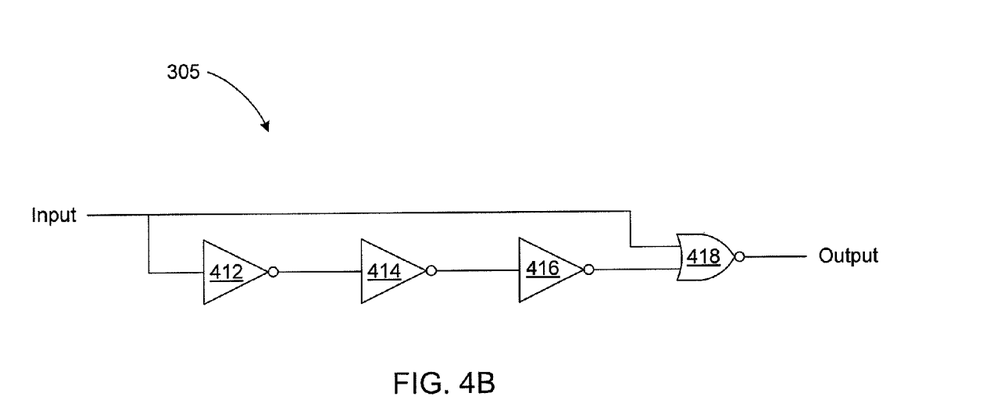
FIG. 4B illustrates a negative edge detector, according to one embodiment of the present invention.

FIG. 4B illustrates the negative pulse edge detector 305, according to one embodiment of the present invention. The negative pulse edge detector 305 includes three invertors 412, 414, 416 followed by a two-input NOR gate 418. The three invertors 412, 414, 416 are connected in series to add a propagation delay to an inverted input to the negative pulse edge detector 305. Both the input and the inverted-delayed input (via invertors 412, 414, 416) are provided as the two inputs to the NOR gate 418. The inverted output of the NOR gate 418 is at a logic level HIGH if the input signal to the negative pulse edge detector 305 transitions from a logic level HIGH to a logic level LOW, until the inverted-delayed input transitions from a logic level LOW to a logic level HIGH. When the inverted-delayed input transitions from a logic level LOW to a logic level HIGH, the NOR gate 418 outputs a logic level LOW. Thus, the pulse length of the inverted output of the NOR gate 418 is equal to the propagation delay in the three invertors 412, 414, 416.

Although FIGS. 4A and 4B illustrate example circuitry that can be used as the positive and negative pulse edge detectors 300, 305, other circuitry can be used to perform the same function. The present invention is not limited to the specific implementation of the positive and negative pulse edge detectors 300, 305 as shown in FIGS. 4A and 4B.

Figure 5:
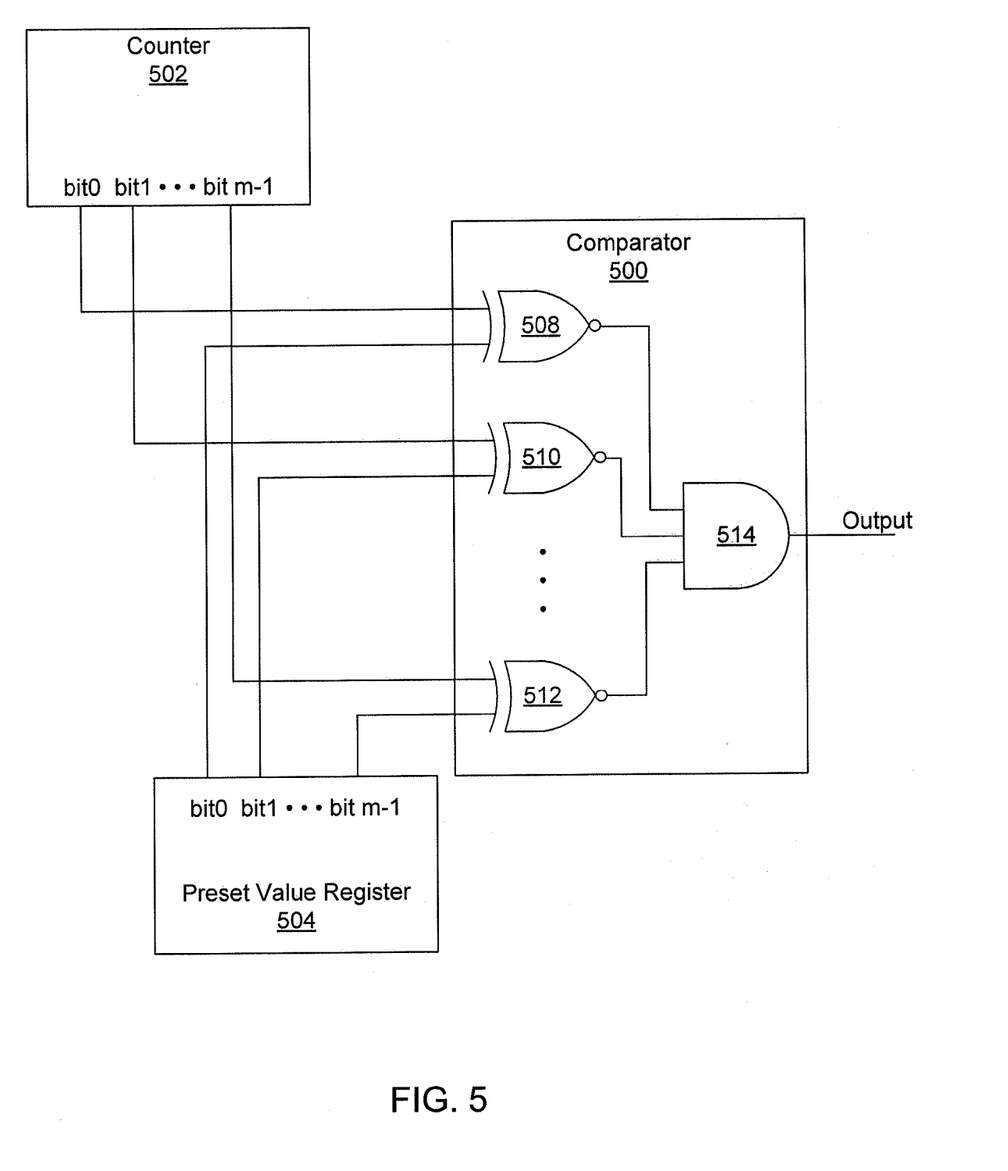
FIG. 5 illustrates a pulse comparator, according to one embodiment of the present invention.

FIG. 5 illustrates a pulse comparator 500, according to one embodiment of the present invention. The pulse comparator 500 can be used, for example, as the preamble pulse comparator 334, the post-amble pulse comparator 344 or the bit=0/bit=1 comparator 336. The comparator 500 includes m two-input XNOR gates 508, 510, 512 and one m-input AND gate 514, where m corresponds to the number of bits representing a binary value of the expected pulse length ($t_{preamble}$, $t_{post-amble}$ or $t_{CLO}$)) multiplied by the frequency (f) of the clock 310. One of the inputs to each XNOR gate 508, 510, 512 is connected to a corresponding bit (e.g., bit 0, bit 1, bit m-1) of a counter 502, while the other input to each XNOR gate 508, 510, 512 is connected to a corresponding bit (bit 0, bit 1, . . . , bit m-1) of a preset value register 504 which stores an expected (i.e., preset) value. The counter 502 may be the time counter 322 or the time counter 342, depending on whether the comparator 500 is the preamble pulse comparator 334, the bit=0/bit=1 comparator 336 or the post-amble pulse comparator 344. The preset value may be a predetermined value corresponding to the expected pulse length ($t_{preamble}$, $t_{post-amble}$, $t_{B0}$ or $t_{B1}$) multiplied by the frequency (f) of the clock 310, and may be either hardwired or stored in any kind of memory. With this arrangement, each of the XNOR gates 508, 510, 512 outputs a logic level HIGH when each of the corresponding bits in the counter 502 and the preset value of the register 504 is equal to each other. When all of the corresponding bits in the counter 502 and the preset values in the register 504 are equal to each other, the AND gate 514 outputs a logic level HIGH as the output of the comparator 500.

Upon reading this disclosure, those of skill in the art will appreciate alternative designs for 1-wire communication between a host device and a driver device. For example, although the communication protocol described herein is illustrated as facilitating communication between a host controller and an LED driver as an example of application, the same communication protocol may be used for communication between any host device and a corresponding driver device using a 1-wire communication interface. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention.

What is claimed is:

1. A communication system, comprising:
a host device comprising a first 1-wire interface controller; and
a driver device coupled to the host device via a 1-wire interface, wherein the driver device comprises a second 1-wire interface controller, the second 1-wire interface controller communicating with the first 1-wire interface controller via a 1-wire communication protocol;
interface commands are transmitted from the host device to the driver device via the 1-wire interface and are decoded by the second 1-wire interface controller;
wherein the interface commands comprise pulse width modulation (PWM) signals and command signals for programming the driver device, the 1-wire communication protocol transmitting the PWM signals during PWM signal transmission mode and transmitting the command signals during command signal transmission mode; and
wherein each interface command comprises a preamble pulse, at least one command pulse and a post-amble pulse, each interface command beginning with the preamble pulse and ending with the post-amble pulse.

2. The communication system claim 1, wherein the 1-wire communication protocol distinguishes between the PWM signal transmission mode and the command signal transmission mode based on a width of specific pulses included in the interface commands.

3. The communication system of claim 1, wherein the 1-wire communication protocol distinguishes between different commands transmitted during the PWM signal transmission mode or between different commands transmitted during the command signal transmission mode based on a width of specific pulses included in the interface commands.

4. The communication system of claim 1, wherein the PWM signals are used to adjust current provided by the driver device to a load circuit based on a pulse width of each PWM signal.

5. The communication system of claim 1, wherein the command signals are used to set current provided by the driver device to a load circuit.

6. The communication system of claim 1, wherein each command pulse is recognized as a binary zero or a binary one depending on a width of the command pulse.

7. The communication system of claim 1, wherein, in response to the preamble pulse, the 1-wire communication protocol transmits the command signals in the command signal transmission mode.

8. The communication system of claim 1, wherein, in response to the post-amble pulse, the 1-wire communication protocol transitions from the command signal transmission mode to the PWM signal transmission mode.

9. The communication system of claim 8, wherein, in response to a subsequent preamble pulse, the 1-wire communication protocol transitions from the PWM signal transmission mode to the command signal transmission mode.

10. The communication system of claim 1, wherein in the event that a first pulse received on the 1-wire interface after receiving a power-up pulse is not a preamble pulse, the 1-wire communication protocol ignores the first pulse and transmits subsequent pulses in the PWM signal transmission mode.

11. The communication system of claim 1, wherein in the event that one of the interface commands comprises less than a predetermined number of command pulses received on the 1-wire interface, the 1-wire communication protocol transitions from the command signal transmission mode to the PWM signal transmission mode.

12. The communication system of claim 1, wherein at least one interface command comprises a shutdown pulse, the 1-wire communication protocol entering a shutdown mode in response to the shutdown pulse.

13. A communication system, comprising:
a host controller comprising a first 1-wire interface controller;
a light emitting diode (LED) driver coupled to the host controller via a 1-wire interface, wherein the LED driver comprises a second 1-wire interface controller, the second 1-wire interface controller communicating with the first 1-wire interface controller via a 1-wire communication protocol; and
a plurality of LEDs coupled to the LED driver;
wherein interface commands are transmitted from the host controller to the LED driver via the 1-wire interface and are decoded by the second 1-wire interface controller,
wherein the interface commands comprise PWM signals and command signals for programming the LED driver, the 1-wire communication protocol transmitting the PWM signals during PWM signal transmission mode and transmitting the command signals during command signal transmission mode, and
wherein each interface command comprises a preamble pulse, at least one command pulse and a post-amble pulse, each interface command beginning with the preamble pulse and ending with the post-amble pulse.

14. The communication system of claim 13, wherein:
the 1-wire communication protocol distinguishes between the PWM signal transmission mode and the command signal transmission mode based on a width of specific pulses included in the interface commands, and
the 1-wire communication protocol distinguishes between different commands transmitted during the PWM signal transmission mode or between different commands transmitted during the command signal transmission mode based on a width of specific pulses included in the interface commands.

15. The communication system of claim 13, wherein:
the command signals are used to set current that is provided by the LED driver to the plurality of LEDs, and
the PWM signals are used to adjust the current that is provided by the LED driver device to the plurality of LEDs based on a pulse width of each PWM signal.

16. The communication system of claim 13, wherein, in response to the preamble pulse, the 1-wire communication protocol transmits the command signals in command signal transmission mode.

17. The communication system of claim 13, wherein, in response to the post-amble pulse, the 1-wire communication protocol transitions from the command signal transmission mode to the PWM signal transmission mode.

18. The communication system of claim 17, wherein, in response to a subsequent preamble pulse, the 1-wire communication protocol transitions from the PWM signal transmission mode to the command signal transmission mode.

19. The communication system of claim 13, wherein in the event that one of the interface commands comprises less than a predetermined number of command pulses received on the 1-wire interface, the 1-wire communication protocol transitions from the command signal transmission mode to the PWM signal transmission mode.

20. The communication system of claim 13, wherein in the event that a first pulse received on the 1-wire interface after receiving a power-up pulse is not a preamble pulse, the 1-wire communication protocol ignores the first pulse and transmits subsequent pulses in the PWM signal transmission mode.

21. A communication system comprising:
a host device having a first 1-wire interface controller; and
a driver device coupled to the host device via a 1-wire interface, wherein the driver device includes a second 1-wire interface controller which communicates with the first 1-wire interface controller via a 1-wire communication protocol; and
wherein the 1-wire communication protocol transmits a preamble pulse causing subsequent pulses to be interpreted as a binary command mode, each pulse following the preamble pulse designating a binary zero or a binary one depending upon pulse width; and
wherein the 1-wire communication protocol also transmits a post-amble pulse designating a pulse width modulation mode causing subsequent pulses to be interpreted as drive power to be provided by the driver device depending upon pulse width.

22. The communication system as in claim 21 wherein the preamble pulse comprises a pulse of a first binary state for a predetermined period and the post-amble pulse comprises a pulse of an opposite binary state for the predetermined period.

23. The communication system of claim 21 wherein in the pulse width modulation mode subsequent pulses are interpreted as average drive current to be provided by the driver device to an load circuit having light emitting diodes therein.

* * * * *